United States Patent
Jackson et al.

(10) Patent No.: US 9,801,269 B1
(45) Date of Patent: Oct. 24, 2017

(54) RESILIENT MINIATURE INTEGRATED ELECTRICAL CONNECTOR

(71) Applicant: Northrop Grumman Systems Corporation, Falls Church, VA (US)

(72) Inventors: Charles M. Jackson, Huntington Beach, CA (US); Elizabeth T. Kunkee, Manhattan Beach, CA (US)

(73) Assignee: Northrop Grumman Systems Corporation, Falls Church, VA (US)

(*) Notice: Subject to any disclaimer, the term of this patent is extended or adjusted under 35 U.S.C. 154(b) by 70 days.

(21) Appl. No.: 15/150,834

(22) Filed: May 10, 2016

(51) Int. Cl.
  *H05K 1/11* (2006.01)
  *H05K 1/14* (2006.01)
  *H05K 1/02* (2006.01)
  *H01P 3/08* (2006.01)
  *H01P 3/06* (2006.01)

(52) U.S. Cl.
  CPC ............... *H05K 1/025* (2013.01); *H01P 3/06* (2013.01); *H01P 3/088* (2013.01); *H05K 1/0242* (2013.01); *H05K 1/144* (2013.01); *H05K 2201/042* (2013.01)

(58) Field of Classification Search
  CPC ...... H05K 1/025; H05K 1/0242; H05K 1/144; H01P 1/306; H01P 3/088
  See application file for complete search history.

(56) References Cited

U.S. PATENT DOCUMENTS

| 4,734,861 | A | * | 3/1988 | Bertolasi | ................ F16H 59/00 |
| | | | | | 477/65 |
| 5,200,885 | A | * | 4/1993 | Hamilton | ........... G01R 31/2863 |
| | | | | | 211/41.17 |
| 5,529,504 | A | | 6/1996 | Greenstein et al. | |
| 5,741,148 | A | * | 4/1998 | Biernath | ................ H01R 12/79 |
| | | | | | 439/284 |
| 5,999,414 | A | * | 12/1999 | Baker | ................ H01R 13/2414 |
| | | | | | 361/744 |
| 6,046,410 | A | | 4/2000 | Wojnarowski et al. | |
| 6,184,053 | B1 | | 2/2001 | Eldridge et al. | |

(Continued)

OTHER PUBLICATIONS

Aitek, S.; 3d Scanning and Printing; Week 5 Assignment; Web Page: http://fabacademy.org/archives/2014/students/zitek.scott/week5.html.

(Continued)

*Primary Examiner* — Yuriy Semenenko
(74) *Attorney, Agent, or Firm* — Patti & Malvone Law Group, LLC

(57) ABSTRACT

A resilient electrical connector assembly includes a base PCB and stacked layers of interconnected resilient conductive structures where each structure has at least two resilient conductive strips and at least two conductive contacts. One contact is integrated with a conductive path on the base PCB and another contact pad is positioned to establish a conductive path with a target PCB when the latter is mounted parallel to the base PCB. The resilient conductive strips flex due to a compressive force exerted between the base PCB and target PCB on the stacked layers. The resilient conductive structures are formed by depositing metal to sequentially form each of the stacked layers with one contact being initially formed in engagement with the conductive path on the base PCB.

9 Claims, 2 Drawing Sheets

(56) References Cited

U.S. PATENT DOCUMENTS

| | | | |
|---|---|---|---|
| 6,255,126 B1* | 7/2001 | Mathieu | G01R 1/06727 438/14 |
| 7,048,548 B2* | 5/2006 | Mathieu | G01R 1/06727 257/E23.021 |
| 7,050,293 B2 | 5/2006 | Arbisi et al. | |
| 7,126,220 B2 | 10/2006 | Lahiri et al. | |
| 7,225,538 B2 | 6/2007 | Eldridge et al. | |
| 7,714,235 B1* | 5/2010 | Pedersen | G01R 1/06727 174/267 |
| 7,928,751 B2 | 4/2011 | Hsu | |
| 8,089,294 B2 | 1/2012 | Hsu et al. | |
| 8,531,042 B2 | 9/2013 | Drost et al. | |
| 2001/0012704 A1* | 8/2001 | Eldridge | G01R 1/0466 439/66 |
| 2010/0165562 A1* | 7/2010 | Segaram | G06F 1/185 361/679.31 |
| 2014/0012216 A1 | 1/2014 | Shaviv | |

OTHER PUBLICATIONS

Manousos, N.; 3D Printed Working Co-Axial Tourbillon 1000%; A Blog to Watch; Web Page: http://www.ablogtowatch.com/3d-printed-working-co-axial-tourbillon-1000-nicholas-manousos-hands/2/; Jul. 26, 2014.

Manousos, N.; Tourbillon 1000% brings 3D printing to watches . . . sort of; gizmag; Web Page: http://www.gizmag.com/tourbillon-1000-3d-printed-mechanical-watch-movement/33121/; Aug. 1, 2014.

Walters, P.; (2009) 3D printing and fabrication of Smart responsive devices: A comparative investigation. In: (2009) NIP25: International Conference on Digital Printing Technologies and Digital Fabrication 2009, Louisville, Kentucky; (Volume) Society for Imaging Science and Technology. ISBN 978-0-89208-287-2; Bristol University of the West of England.

Chowdhury, S. et al.; Microelectromechanical systems and system-on-chip connectivity; Circuits and Systems Magazine, IEEE , vol. 2, No. 2, pp. 4-28, Second Quarter 2002; doi:10.1109/MCAS.2002.1045855.

Chowdhury, S. et al.; A MEMS socket system for high density SoC interconnection; Circuits and Systems, 2002. ISCAS 2002. IEEE International Symposium on , vol. 1, No., pp. 1-657-1-660 vol. 1, 2002 doi:10.1109/ISCAS.2002.1009926.

Kandalaft, N.; High Speed Test Interface Module Using MEMS Technology; (2012). Electronic Theses and Dissertations. University of Windsor (Ontario, Canada). Paper 4818.

Pruitt, B.L. et al.; Measurement system for low force and small displacement contacts; Microelectromechanical Systems, Journal of , vol. 13, No. 2, pp. 220-229, Apr. 2004 doi:10.1109/JMEMS.2003.820266.

* cited by examiner

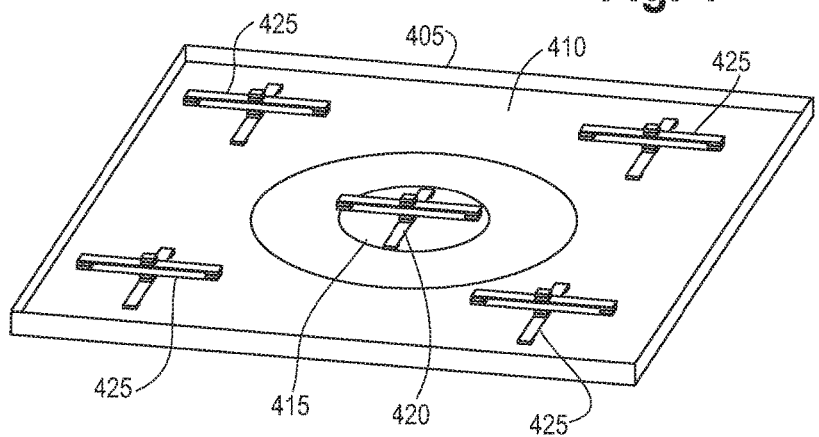
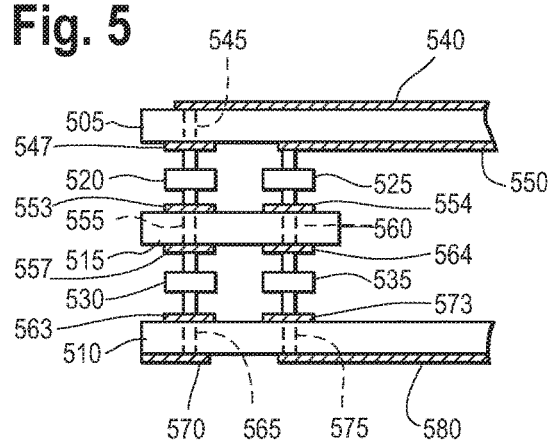
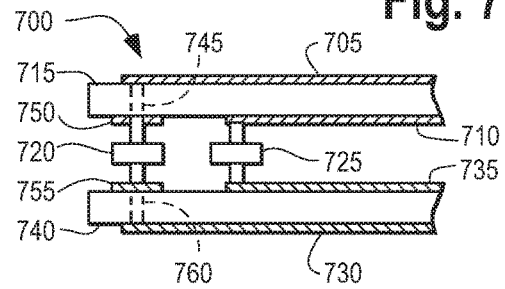
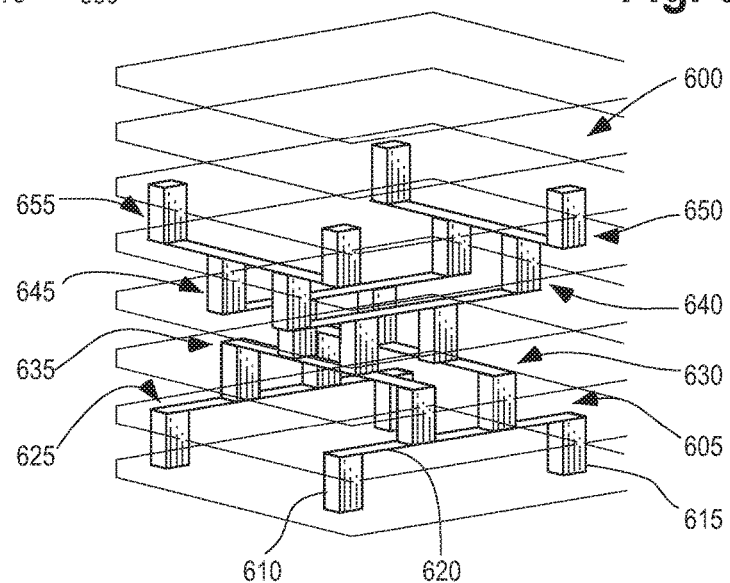

RESILIENT MINIATURE INTEGRATED ELECTRICAL CONNECTOR

BACKGROUND

This invention relates to establishing an electrical connection between two substrates or printed circuit boards.

Modern electronics often contain circuitry formed on a plurality of stacked layers/boards, e.g. between two parallel printed circuit boards (PCB), between two parallel substrates with patterned metallization, between a multi-element antenna array and an interconnection board, or between two layers of a microwave module or integrated circuit. Where multiple stacked surfaces are used, there exists a need to provide electrical interconnections and for some applications a resilient electrical interconnection is advantageous where the distances between the surfaces may change or may not be uniform. One approach for coupling electrical signals is to use a solderball between the respective conductive pads on the two adjacent layers. In another approach, a fuzz button can be placed between the two adjacent layers. However, fuzz buttons are normally time-consuming and/or tedious to install. Solder bumps require subsequent heating and if several such connections are required, uneven heating or differences in characteristics among the solder bumps may yield unreliable or inconsistent connections. The solder balls or fuzz buttons are additional parts that must be attached to the layers of the circuit and increase the "touch labor". The disassembly of layers connected using either of these techniques for maintenance or repair of the circuitry may result in even greater difficulties where such interconnections are required to be manually reestablished during reassembly of the respective layers. Additionally, the minimum practical size of fuzz buttons may negatively impact the performance of RF circuits above a frequency, e.g. above 20 GHz. Thus, there exists a need for an improved resilient interconnector that minimizes such difficulties.

SUMMARY

It is an object of the present invention to satisfy this need.

A resilient electrical connector assembly includes a base PCB and stacked layers of interconnected resilient conductive structures where each structure has at least two resilient conductive strips and at least two conductive contacts. One contact is integrated with one surface and engages a conductive path on the base PCB and another contact is positioned to establish a conductive path with a target PCB when the latter is mounted parallel to the base PCB. The integrated resilient conductive strips flex due to a compressive force exerted between the base PCB and target PCB on the stacked layers. The resilient conductive structures are additively manufactured by depositing metal to sequentially form each of the stacked layers with one contact being initially formed in engagement with the conductive path on the base PCB.

Another embodiment of the invention includes the use of a spacer board between the base PCB and target PCB with two sets of stacked layers forming the resilient conductive structures. One of the sets is disposed between the base PCB and the spacer board and the other set is disposed between the spacer board and the target PCB. A conductive Via traversing the spacer board connects the two sets and the connections provide a conductive path from the base PCB to the target PCB.

DESCRIPTION OF THE DRAWINGS

Features of exemplary implementations of the invention will become apparent from the description, the claims, and the accompanying drawings in which:

FIG. 4 is a partial view illustrating an application of embodiments utilized to form a coaxial-type connection for a high frequency RF signal.

FIG. 5 is a representative cross-sectional view of exemplary connectors providing an electrical connection between adjacent layers/boards via an intermediate spacer/board.

FIG. 6 is a perspective view of an alternate embodiment of an electrical connector of the present invention.

FIG. 7 is a representative cross-sectional view of exemplary connectors providing an electrical connection between adjacent layers/boards.

DETAILED DESCRIPTION

Figure 1:
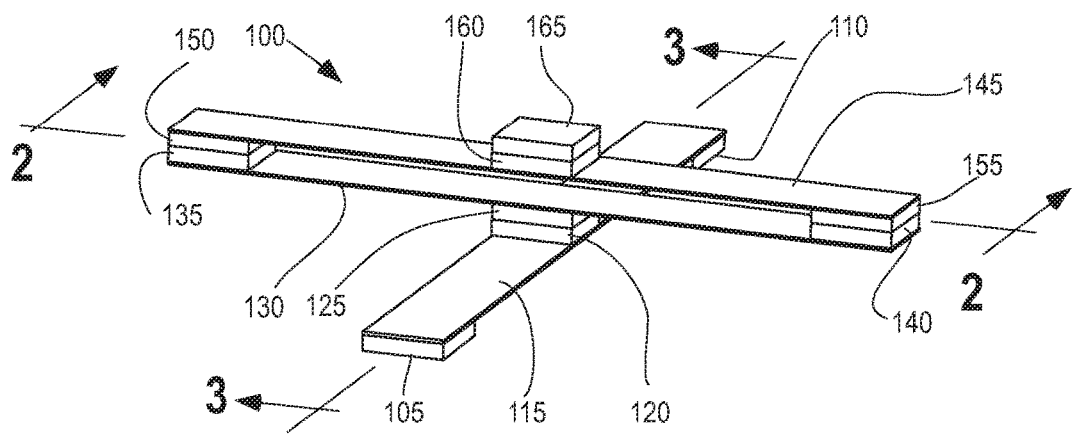
FIG. 1 is a perspective view of an exemplary embodiment of a resilient interconnector in accordance with the present invention.
Figure 2:
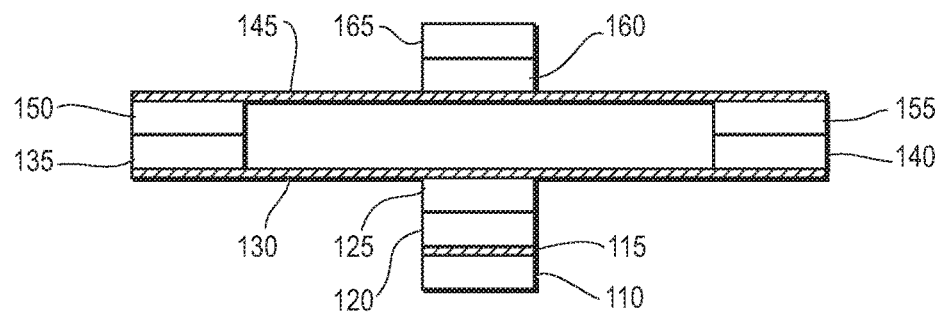
FIG. 2 shows a front elevational view of the embodiment of FIG. 1.
Figure 3:
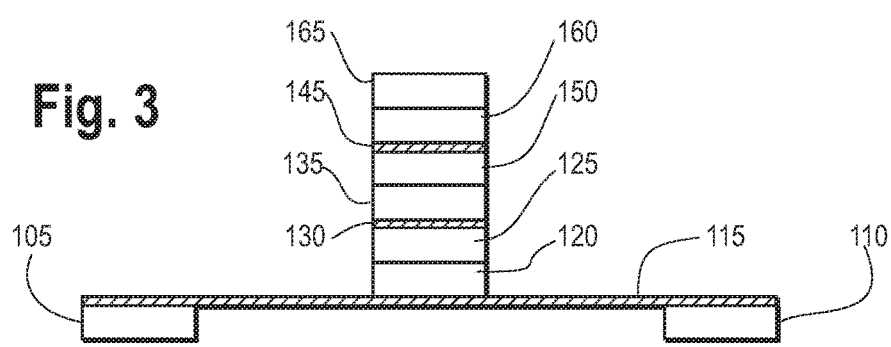
FIG. 3 shows a side elevational view of the embodiment of FIG. 1.

FIGS. 1, 2 and 3 show an exemplary embodiment of a miniature resilient interconnector 100 having an "X" general shape. As used herein, "miniature" refers to a structure having a maximum strip length of 10 mils (250 um) The top surface of the conductive base connection blocks 105 and 110 support a conductive, resilient, elongated strip 115. As used herein, the referenced "strip(s)" means generally thin planar layers that could have shapes other than rectangular, e.g. oval, circular, etc. The bottom surfaces of the conductive base connection blocks 105 and 110 are integrated onto the PCB to engage and make electrical connection with a planar conductive element such as an area of copper on an adjacent printed circuit board (PCB). As used herein, a PCB includes all forms of structures having at least one generally planar surface. The bottom surface of conductive block 120 engages the middle of strip 115. The top surface of conductive block 120 engages the bottom surface of conductive block 125 which has a top surface that engages the middle of elongated strip 130. Another elongated conductive strip 145 is mounted above strip 130 in a plane parallel to strip 130 and is supported by conductive blocks 135 and 150 at one end and conductive blocks 140 and 155 at the other end. The ends of conductive strip 130 engage and provide support for conductive blocks 135, 150, 140 and 155. Mounted near the middle of conductive strip 145 is conductive block 160 which has mounted thereto conductive block 165. The conductive strips 115, 130 and 145 are each a conductive, resilient, elongated strip. The top surface of conductive block 165 is disposed to engage and establish an electrical connection with another conductive element such as an area of copper on another PCB that is spaced apart from the PCB that engages conductive blocks 105 and 110.

Because all of the described elements provide electrical conductivity and engage adjacent elements, an electrical connection is established between the bottom surfaces of conductive blocks 105/110 and the top surface of conductive block 165. The thickness of conductive blocks 135, 150 and 140, 155 establishes a spacing between conductive strips 130 and 145 that permits strip 145 to be resiliently deflected downward at its middle due to a compressive force applied to the top surface of block 165 relative to blocks 105, 110.

Additionally, due to the same compressive force, elongated strip 115 may be resiliently deflected downward and may engage the same conductive surface engaged by the bottom surfaces of blocks 105, 110. Without the application of a compressive force, each of the strips 115, 130 and 145 preferably lies within a plane, i.e. is relatively straight. Strip 115 is substantially transverse to strips 130, 145. As will be appreciated, the maximum possible deflection upon the application of a compressive force would be the sum of the distances of the thickness of block 105 (assuming block 110 is the same thickness), the thickness of block 135, and the thickness of block 150 (assuming blocks 140, 155 have the same corresponding thicknesses). Preferably, the two surfaces to be connected by connector 100 have a final mounted position relative to each other in which the distance between the two surfaces supplies some amount of compressive force to connector 100 which is utilized to provide an electrical interconnection between first and second locations of engagement on the two surfaces, respectively.

Exemplary dimensions are 10 um to 100 um for the width of 130 and 100 um to 1000 um for the length of 115 of FIG. 3. Due to the precision of the manufacturing process the minimum spacing between parts can be as small as 10 um and as great as the size of the substrate. This will enable 5-wire coaxial RF structures that are typically 25 to 500 um apart. By using different metals, the stiffness of the structure can be adjusted to range from an easier to compress structure using Au, to a stiffer structure using Ti and Ni, that will approach the rigidity of a fuzz button.

Microelectronics fabrication builds up patterned layers of dielectric and metal materials. Dielectrics typically include "hard" dielectrics such as silicon nitride and "soft" dielectrics such as BCB (benzocyclobutane). Metals can be plated or evaporated and commonly plated metals are nickel which can add strength, e.g. adding strength to the embodiments of the invention, and gold, which forms excellent contacts and does not develop highly resistive oxide layers. The interconnector 100 is preferably made by patterning photoresist 7 times (7 different masks), with a metal plating step for each mask layer concurrent with the manufacture of a parent PCB for which connections are required with another PCB. Thus, the metal surface of the blocks of the interconnector 100 that engage the parent PCB are deposited directly on the conductive path of the PCB for which a connection with another PCB is needed.

FIG. 4 is a partial view of a quartz (or other substrate) PCB illustrating an application of embodiments of the use of the X structures utilized to form a coaxial-type connection for a high frequency RF signal. As used herein, a radio frequency (RF) signal refers to signals having frequency less than 20 GHz and a high frequency RF signal refers to signals having a frequency greater than 20 GHz. A nonconductive substrate 405 of the PCB supports a conductive surface 410 that in the illustrative example surrounds an interior conductive pad 415 separated by a surrounding nonconductive area from the conductive surface 410. A contact 420 in accordance with an embodiment of the present invention conductively engages pad 415. Four contacts 425 are conductively mounted to conductive surface 410 preferably in a symmetrical spaced apart relationship to pad 415. The contacts 420 and 425 form what is referred to as a "5 wire" connection that provides a piecewise linear representation of a cylindrical coaxial cable where contact/connector 420 supplies a connection for the center conductor of the simulated coaxial cable and the contacts/connectors 425 supply a connection representing the outer braid of the simulated coaxial cable. The spacing between pad 415 and the surrounding surface 410 as well as the spacing between connector 420 and the surrounding connectors 425 can be varied to provide different impedance characteristics of the simulated coaxial cable in order to match a corresponding desired impedance and minimize an impedance discontinuity due to the interconnections provided by the connectors. Another PCB (not shown which could be an organic material or a hard substrate like quartz) would be mounted parallel to surface 410 in a final assembled position and would have an aligned conductive pad opposing pad 415 and aligned conductive surfaces opposing each of connectors 425. Preferably the another PCB will be mounted so that its facing surface will have a substantially uniform distance from surface 410 and will have a spacing such that a desired amount of compressive force is supplied to the connectors 420, 425. Thus, in a final mounted position, the connectors 420, 425 will provide a 5 wire connection supporting the coupling of a high frequency RF signal between two PCBs. Although a 5 wire connection is illustrated, it will be apparent that single independent connections can be made utilizing the connectors to support the transmission of lower frequency signals and/or DC signals between the two respective PCBs. Various conventional nonconductive spacers disposed between the two PCBs can be used to establish and maintain a desired spacing therebetween in order to control the amount of compressive force applied to the respective connectors.

FIG. 5 illustrates an application of exemplary connectors in accordance with the present invention. A PCB 505 is connected to a PCB 510 through an intermediate PCB 515 and connectors 520, 525, 530 and 535 such as previously described. The top surface of PCB 505 has a conductive path 540 coupled to a conductive pad 547 on the bottom surface of PCB 550 by Via 545. The bottom surface of PCB 505 has a conductive path 550. The conductive path 540 is connected by Via 545, pad 547, connector 520, pad 553 on the top surface of PCB 515, Via 555 of PCB 515, pad 557 on the bottom of PCB 515, connector 530, pad 563 on the top surface of PCB 510, Via 565 of PCB 510 to the conductive path 570 on the bottom surface of PCB 510. The conductive path 550 is connected by connector 525, pad 554 on the top surface of PCB 515, Via 560 of PCB 515, pad 564 on the bottom surface of PCB 515, connector 535, pad 573 on the top surface of PCB 510 and Via 575 of PCB 510 to conductive path 580 on the bottom surface of PCB 510. The spacing between the bottom surface of PCB 505 and the top surface of PCB 515, and the spacing between the bottom surface of PCB 515 and the top surface of PCB 510 are dimensioned to provide the desired amount of compressive force to the respective connectors 520, 525, 530 and 535. Should there be a need to space PCB 505 and 510 an even greater distance apart, the thickness of PCB 515 can be selected to have an increased thickness to maintain the desired compressive force on the connectors.

FIG. 6 shows a perspective view of an alternate embodiment of another connector 600 in accordance with the present invention. Connector 600 includes five stacked layers of interconnecting elements. A first, base element 605 includes conductive blocks 610 and 615 connected to the respective ends of resilient conductive strip 620. The other base element 625 is substantially identical to element 605 with the respective conductive strips being parallel to each other and spaced apart. Intermediate elements 630 and 635 are substantially identical to element 605. Elements 630 and 635 have spaced apart parallel resilient conductive strips supported at the respective ends by conductive blocks that are supported by intermediate positions along the respective conductive strips of base elements 605 and 625. Elements 640 and 645 have spaced apart parallel conductive strips each supported by two blocks having upward facing ends engaging intermediate portions of the strips and downward facing ends that rest on intermediate portions of the strips of elements 630 and 635. Each of the distal ends on the top surface of the strips of elements 640 and 645 support upward projecting blocks that engage and support intermediate portions of the spaced apart parallel conductive strips of top elements 650 and 655. Upward projecting conductive blocks are disposed near the distal ends and on the top surface of the respective strips of top elements 650 and 655; the top ends of these blocks are disposed to engage an upper surface to which a conductive path is to be established. The bottom ends of the blocks associated with base elements 605 and 625 are disposed to engage a lower surface to which the conductive path is to be established. In accordance with the subject connector 600, resilient conductive strips are disposed in four parallel spaced apart planes, e.g. stacked, in order to accommodate a substantial amount of compression and span a greater distance. It will be apparent that the blocks and resilient strips must each be conductive, or at least contain a conductive path, in order to establish an electrical connection between two spaced apart parallel surfaces. In order to facilitate ease of assembly and reassembly, the connector 600 is preferably fabricated as an integrated part of one of the surfaces to be connected, i.e. part of one of the PCBs, so that it is permanently attached to that board and does not have to be independently placed between the surfaces requiring interconnection.

FIG. 7 illustrates another application of exemplary connectors in accordance with the present invention. A conductive path 705 of PCB 715 is connected by connector 720 with the conductive path 730 of PCB 740. More specifically, the conductive path 705 is connected through Via 745 to a pad 750 on the bottom surface of PCB 715, connector 720 that is under compression between pad 750 on the bottom surface of PCB 715 and pad 755 on the top surface of PCB 740, Via 760 which is connected to conductive path 730. Conductive path 710 on the bottom surface of PCB 715 is connected by connector 725 which is under compression between conductive path 710 and conductive path 735 of the top surface of PCB 740. The spacing between the bottom surface of PCB 715 and the top surface of PCB 740 is dimensioned to provide the desired amount of compressive force to the respective connectors 720, 725. This may, for example, be accomplished by the use of appropriately dimension spacers disposed at various locations between PCB 715 and PCB 740 to establish and control the assembled PCB spacing.

Although exemplary implementations of the invention have been depicted and described in detail herein, it will be apparent to those skilled in the art that various modifications, additions, substitutions, and the like can be made without departing from the spirit of the invention.

The scope of the invention is defined in the following claims.

The invention claimed is:

1. A resilient integrated electrical connector assembly for providing an electrical interconnection with a target printed circuit board (PCB), the miniature resilient electrical connector assembly comprising:
   a base PCB with at least one conductive path on one surface;
   stacked layers of interconnected resilient conductive structures where each structure has at least one resilient conductive strip and at least one conductive contact attached to the at least one resilient conductive strip, all the resilient conductive structures being conductively connected together to form a miniature connector;
   first and second conductive contacts mounted to and extending perpendicular from one surface of one of the resilient conductive strips in one of the stacked layers, the first and second conductive contacts engaging the at least one conductive path on the base PCB;
   a third conductive contact mounted to and extending perpendicular from a surface of another resilient conductive strip disposed in another of the stacked layers and positioned to establish a conductive path on the target PCB when the latter is mounted parallel to the base PCB;
   the first and second conductive contacts positioned on the one surface of the one resilient conductive strip to allow flexing of the one resilient conductive strip due to a compressive force exerted between the base PCB and target PCB;
   the third conductive contact positioned on the another resilient conductive strip to allow flexing of the another resilient conductive strip due to the compressive force exerted between the base PCB and target PCB;
   the resilient conductive structures formed by depositing metal to sequentially form each of the stacked layers with the first and second conductive contacts being initially formed in engagement with the at least one conductive path on the base PCB.

2. The resilient electrical connector assembly of claim 1 wherein the first and second conductive contacts are mounted near distal ends of the one resilient conductive strip.

3. The resilient electrical connector assembly of claim 1 wherein the one resilient conductive strip is fabricated, after the forming of the first and second conductive contacts, by depositing metal which forms the one resilient conductive strip between the first and second conductive contacts.

4. The resilient electrical connector assembly of claim 1 wherein each of at least one resilient conductive strips in each of the stacked layers are disposed in planes parallel to each other.

5. The resilient electrical connector assembly of claim 1 wherein each of at least one resilient conductive strips in each of the stacked layers are supported to facilitate flexing due to the compressive force.

6. The resilient electrical connector assembly of claim 1 wherein the at least one resilient conductive strip in one stacked layer has a contact which is disposed to engage another of the at least one resilient conductive strip in an adjacent stacked layer so that each stacked layer is supported by an adjacent stacked layer.

7. The resilient electrical connector assembly of claim 1 wherein the maximum length of the at least one resilient conductive strip is 10 mils (250 um) so that frequencies exceeding 20 GHz are transported by the miniature connector without adverse impedance changes.

8. The resilient electrical connector assembly of claim 7 wherein a radio frequency (RF) signal on the base PCB is transported to the target PCB by an array of the laterally positioned miniature connectors simulating a coaxial connection, the array having 5 miniature connectors with a first miniature connector providing a center connector of the coaxial connection and the other 4 miniature connectors equally spaced from the first miniature connector which together simulate a shield of an outer coaxial connection.

9. A resilient electrical connector assembly comprising:
stacked layers of interconnected resilient conductive structures where each structure has at least one resilient conductive strip and at least one conductive contact attached to the at least one resilient conductive strip, all the resilient conductive structures being conductively connected together to form a miniature connector;
a base PCB with at least one conductive path on one surface;
a spacer board with first and second parallel planar surfaces, a first conductive Via traversing the spacer board to connect first and second conductive pads on the first and second surfaces, respectively, the spacer board disposed between the base PCB and a target PCB;
a first miniature connector disposed between the base PCB and the spacer board;
a second miniature connector disposed between the spacer board and the target PCB;
the first miniature connector forming a conductive path between the at least one conductive path on the one surface of the base PCB and the first pad on the first surface of the spacer board;
the second miniature connector positioned establishing a conductive path with the second pad on the second surface of the spacer board and positioned to provide a conductive path with the target PCB;
the width of the spacer board establishing a distance between the base and target PCBs with a predetermined compressive force being exerted on the first and second miniature connectors.

\* \* \* \* \*